(12) United States Patent
Tseng

(10) Patent No.: US 10,830,912 B2
(45) Date of Patent: Nov. 10, 2020

(54) INTEGRATED SIDE-BY-SIDE PIXEL-ARRAY SENSOR-BASED MULTI-ENERGY RANGE X-RAY DETECTOR

(71) Applicant: X-Scan Imaging Corporation, San Jose, CA (US)

(72) Inventor: Hsin-Fu Tseng, Los Altos, CA (US)

(73) Assignee: X-Scan Imaging Corporation, San Jose, CA (US)

(*) Notice: Subject to any disclaimer, the term of this patent is extended or adjusted under 35 U.S.C. 154(b) by 0 days.

(21) Appl. No.: 16/215,409

(22) Filed: Dec. 10, 2018

(65) Prior Publication Data
US 2019/0179038 A1 Jun. 13, 2019

Related U.S. Application Data

(60) Provisional application No. 62/596,248, filed on Dec. 8, 2017.

(51) Int. Cl.
| | |
|---|---|
| *G01T 1/208* | (2006.01) |
| *G01T 7/00* | (2006.01) |
| *G01V 5/00* | (2006.01) |
| *G01T 1/24* | (2006.01) |
| *G01T 1/20* | (2006.01) |
| *H01L 27/146* | (2006.01) |

(52) U.S. Cl.
CPC ............ *G01T 1/208* (2013.01); *G01T 1/2018* (2013.01); *G01T 1/244* (2013.01); *G01T 7/00* (2013.01); *G01V 5/0041* (2013.01); *H01L 27/14658* (2013.01)

(58) Field of Classification Search
CPC .................................................... G01N 23/087
See application file for complete search history.

(56) References Cited

U.S. PATENT DOCUMENTS

| | | | | |
|---|---|---|---|---|
| 6,013,892 A | * | 1/2000 | Buda .................... | B23K 11/252 219/110 |
| 2013/0003934 A1 | * | 1/2013 | Atzinger ............... | G01T 1/2018 378/97 |
| 2014/0185759 A1 | * | 7/2014 | Kang ..................... | G01N 23/04 378/62 |

* cited by examiner

*Primary Examiner* — Yara B Green
(74) *Attorney, Agent, or Firm* — Invent Capture, LLC.; Samuel S. Cho

(57) ABSTRACT

A dual or multi-energy range x-ray image sensor is implemented as side-by-side pixel arrays on a planar and monolithic semiconductor substrate as part of an x-ray object detector. Each pixel array in this side-by-side monolithic arrangement is designed to be responsive to a particular x-ray energy range or spectrum (i.e. a high-energy (HE) range or a low-energy (LE) range) to provide high object sensitivity and material discrimination capabilities. The side-by-side monolithic construction of pixel arrays improves alignment and spacing precision for improved image alignment among different arrays specialized in detecting different energy levels and signatures. Furthermore, integrated signal processing circuitry, placed on a radiation-shielded periphery of the pixel arrays, enables improved detection performance with enhanced noise reduction and/or sensitivity. This novel configuration is scalable by increasing the number of side-by-side and monolithically-placed pixel arrays, each of which is specialized in detecting a specific energy range from a scanned object.

20 Claims, 12 Drawing Sheets

A Top View of Two-Row Pixel Arrays with Its Associated MOS Devices as Parts of the Novel Side-by-Side Dual-Energy Range Sensor Arrangement Structure An Example of a Novel Side-by-Side Dual-Energy Range Sensor Arrangement Structure

100

A Top View of Two-Row Pixel Arrays with Its Associated MOS Devices as Parts of the Novel Side-by-Side Dual-Energy Range Sensor Arrangement Structure

200

A Novel Side-by-Side Multi-Energy Range Array Sensor Arrangement Structure Receiving an X-Ray Energy

300

A Novel Tile Formation Created from a Novel Side-by-Side Dual Energy-Range Sensor Arrangement Structure

400

A Novel Side-by-Side Dual-Energy Range Sensor Arrangement Structure Utilizing a TDI Sensor

500

A Novel Side-by-Side Dual-Energy Range Sensor Arrangement Structure With Pixel Binning for Various Pixel Sizes.

600

An Example of an Interdigitated HE and LE Pixel Structure

700

An Example of an Interdigitated HE and LE Pixel Structure in TDI Array

800

An Example of a Common Centroid LE/HE/LE TDI Array Structure

900

Another Example of a Common Centroid HE/LE/HE TDI Array Structure

1000

An Example of a Common Centroid Checkered TDI Array

1100

An Example of an Interdigitated HE and LE Pixel Structure with Uneven Pixel Sizing in a TDI Configuration

1200

INTEGRATED SIDE-BY-SIDE PIXEL-ARRAY SENSOR-BASED MULTI-ENERGY RANGE X-RAY DETECTOR

CROSS-REFERENCE TO RELATED APPLICATION

This application claims the benefit of U.S. Provisional Patent Application No. 62/596,248, filed Dec. 8, 2017, the contents of which are hereby incorporated by reference in its entirety.

BACKGROUND OF THE INVENTION

The present invention relates to solid-state image sensors and their structural arrangements. More specifically, the invention relates to an integrated dual-energy band or multi-energy band x-ray imaging sensor and their novel structural arrangements.

A dual-energy (DE) range image sensor typically includes a low-energy (LE) imaging pixel array specifically sensitive to LE x-ray spectrum, and a high-energy (HE) imaging pixel array specifically sensitive to HE x-ray spectrum. DE range image sensors allow detection of distinct characteristics between dissimilar materials. DE x-ray imaging utilizes a physical principal that dissimilar materials generally exhibit distinctive x-ray absorption spectra profiles. The x-ray absorption spectrum of a particular material under exposure is a function of the material's elemental composition and its density. The ratios of the average absorption coefficients across a sensor's LE array spectral response and the average absorption coefficients across a sensor's HE array spectral response are often distinctive among various materials. This difference in the absorption coefficient ratios enables the DE range image sensor to distinguish between dissimilar materials. Key requirements of the DE range image sensor are good signal-to-noise ratios (SNR's) to improve image quality and the discrimination between materials, and good registration between LE and HE arrays for accurate identification of the material.

A conventional DE range image sensor includes a pair of one-dimensional (1D) linear diode arrays (LDA's). The DE LDA image sensors are used to improve material discrimination in applications, such as airport baggage security screenings and food safety inspections. These applications use a scanning imaging system where x-ray specimens are transported or "scanned" perpendicular to the 1D arrays. The 1D arrays image at a high line rate to capture "slices" of the specimens and the slices are combined to form a two-dimensional image.

In a conventional DE range x-ray system, the LE and HE arrays are arranged in a "stacked" configuration where the arrays are required to be in parallel and aligned such that the straight-line x-ray path emanating from the x-ray source and intersecting the pixels of the LE array continue to impinge on the corresponding pixels of the HE array. In the conventional DE range x-ray system, a filter that selectively filters out the LE x-rays is typically sandwiched between the LE and the HE arrays. The LE array may also include x-ray scintillators that are specifically sensitive to the LE x-ray spectrum. Likewise, the HE array typically includes x-ray scintillators that are specifically sensitive to the HE x-ray spectrum. Due to limitations in detector technologies, the LE and HE x-ray spectra are usually overlapping. Defining the transition energy as being the crossover point at which the LE and HE sensitivities are equal, from 0 keV to the transition energy, the LE sensitivity is higher than the HE sensitivity. From the transition energy up to the x-ray electron beam energy, the HE sensitivity is greater than the LE sensitivity. The transition energy can vary greatly, but is roughly half of the electron beam energy. For example, in an x-ray source, with an electronic beam accelerating voltage of 100 kV, and thus an electron beam energy of 100 keV, the transition energy can be 50 keV, so the LE sensitivity is the greater between 0 keV and 50 keV and the HE sensitivity is the greater between 50 keV and 100 keV.

In a conventional x-ray scanner system, the x-rays emanate in a fan-beam from the x-ray target. Since x-rays are photons, they must travel in an essentially straight path. For an effective HE-to-LE registration resulting in high-sensitivity material discrimination, the arrays can follow an arc with constant radius around the x-ray target. Short straight array segments facilitate the manufacture of arrays and still approximate an arc. In this configuration, each straight segment is normal to the x-rays to keep registration between HE and LE pixels. Alternatively, short straight arrays are staggered to maintain the normal orientation to the x-rays, while conforming to non-circular geometries.

There are several disadvantages with such prior art techniques. First, it may be difficult to provide independent control for the high energy detector array because anything done on the low energy detector array will have a direct influence on the high energy detector array. Second, the low energy detector also often attenuates high energy photons, which in turn limits the selectivity and the discriminating power of the overall device. Third, alignment of the two detectors may often limits the choice of optimal filtering material. Fourth, aligning two separate arrays causes mechanical difficulties.

Another potential configuration for DE sensors is "side-by-side." In this instance, the dual imaging arrays are arranged side-by-side and in parallel, so that corresponding HE and LE pixels are spaced by a specific offset. Again, the pixel arrays are perpendicular to the scan axis. The offset between HE and LE is parallel to the scan axis. As the x-ray specimens are transported across the arrays, there is a finite time for a point on projected image of a specimen to travel between the HE and LE pixels. The synchronization of the HE and LE images compensate for this time difference.

The side-by-side DE configuration alleviates some of the known disadvantages of the stacked configuration. In particular, it provides independent control for the HE detector array without the LE detector array directly influencing the x-rays absorbed by the HE detector array, and the LE detector does not attenuate the HE photons. Furthermore, the alignment of the tow detectors does not limit the choice of optimal filtering material, and the mechanical alignment is not as difficult.

Unfortunately, there are still several unresolved disadvantages with conventional side-by-side techniques. First, construction tolerances can lead to imprecise alignment and spacing between two arrays and poor image registrations. Second, the space between the two arrays can lead also to poor image registrations. Third, the signal-to-noise ratio (SNR) needed for a higher image quality is limited by the parasitic impedances in the detector construction and by the lack of other improvements accompanying the integration of signal processing circuitry. Furthermore, the multiple chips and wire bonding between the arrays and signal processing increases assembly complexity and cost. Moreover, in some cases, conventional methods of dual-energy imaging alone do not discriminate sufficiently between materials, thus requiring multi-energy or spectral imaging that are not easily scalable from existing conventional side-by-side techniques.

Therefore, it may be desirable to devise a novel dual-energy range x-ray detector that provides an improved and simpler alignment of x-ray-sensing pixels, which result in higher-quality object scanning characteristics and lower manufacturing and assembly costs.

In addition, it may also be desirable to provide a novel dual-energy range x-ray detector that reduces undesirable parasitic impedances and improves SNR via monolithic integration and selective radiation shielding of signal processing circuitry in the same substrate as x-ray-sensing pixel arrays.

Furthermore, it may also be desirable to devise a novel x-ray detector with a novel monolithic integration of x-ray-sensing pixel arrays that are readily scalable to multi-energy ranges beyond two distinct spectral response ranges provided by a dual-energy range x-ray detector.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

The following presents a simplified summary in order to provide a basic understanding of some aspects of the claimed subject matter. This summary is not an extensive overview and is not intended to identify key/critical elements or to delineate the scope of the claimed subject matter. Its purpose is to present some concepts in a simplified form as a prelude to the more detailed description that is presented later.

The present invention provides a new structure for a dual-energy or multi-energy range x-ray imaging scanner detector. In one embodiment, the novel structure contains a planar and monolithic semiconductor substrate containing multiple arrays of photoelements and a signal processing circuitry, which may be a metal-oxide semiconductor device. The signal processing circuitry is coupled to the multiple arrays of elements. Each array of elements is selectively responsive to a specific x-ray energy range or spectrum. The multiple arrays of elements devised in an embodiment of the present invention are designed to be easily scalable to multiple columns of arrays for creating a multi-energy range x-ray detector.

One possible arrangement for the multiple arrays is side-by-side linear arrays where each array is perpendicular to the scan direction. In the dual-energy range case, there are two arrays of x-ray-sensing pixels. In multi-energy range cases beyond the dual-energy range, there may be "n" number of arrays corresponding to the number of distinct spectral responses available from the x-ray-sensing pixels.

Another possible arrangement has two-dimensional arrays that perform a time-delayed integration (TDI) function for each energy range. In this instance, the multiple arrays may be interspersed to provide balance between arrays.

DETAILED DESCRIPTION

Figure 1:
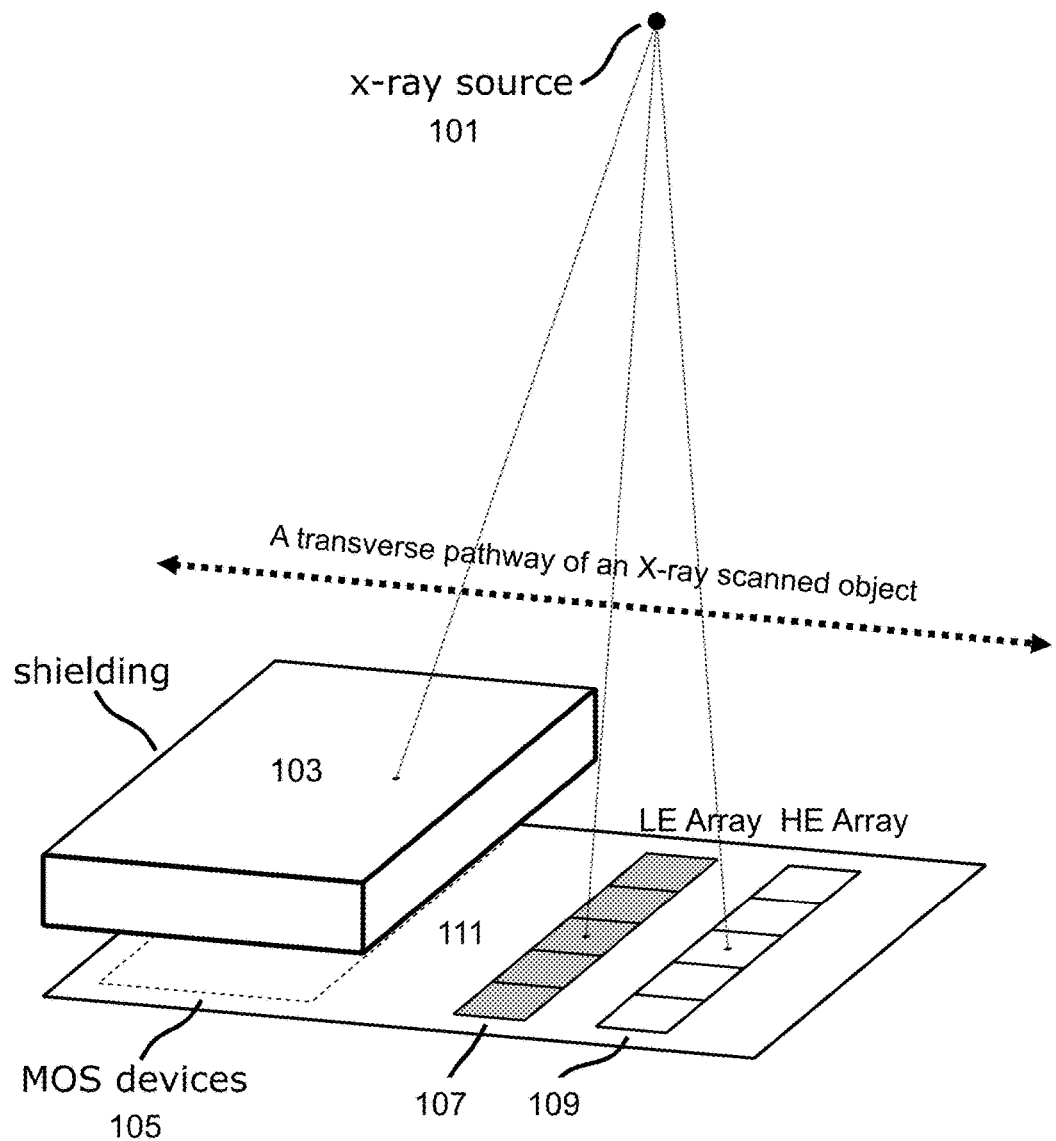
FIG. 1 shows an example of a novel side-by-side dual-energy range sensor arrangement structure, in accordance of an embodiment of the invention.

Specific embodiments of the invention will now be described in detail with reference to the accompanying figures. Like elements in the various figures are denoted by like reference numerals for consistency.

In the following detailed description of the present invention, numerous specific details are set forth in order to provide a thorough understanding of the present invention. However, it will become obvious to those skilled in the art that the present invention may be practiced without these specific details. In other instances, well known methods, procedures, and/or components have not been described in detail to avoid unnecessarily obscuring aspects of the present invention. The detailed description is presented largely in terms of procedures, logic blocks, processing, and/or other symbolic representations that directly or indirectly resemble an integrated side-by-side pixel-array sensor-based multi-energy range x-ray detector, a side-by-side dual or multi-energy range sensor arrangement structure, or a method of operating thereof. These descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

An objective of an embodiment of the present invention is to provide a novel dual-energy range x-ray detector with side-by-side pixel array sensors monolithically integrated with a signal processing circuitry in a single substrate that enables an improved and simpler alignment of x-ray-sensing pixels, resulting in higher-quality object scanning characteristics and lower manufacturing and assembly costs.

Another objective of an embodiment of the present invention is to provide a novel dual-energy range x-ray detector that reduces undesirable parasitic impedances and improves SNR via monolithic integration and selective radiation shielding of signal processing circuitry in the same substrate as x-ray-sensing pixel arrays.

In addition, another objective of an embodiment of the present invention is to provide a novel x-ray detector with a novel monolithic integration of x-ray-sensing pixel arrays that are readily scalable to multi-energy ranges beyond two distinct spectral response ranges provided by a dual-energy range x-ray detector.

FIG. 1 shows an example of a novel side-by-side dual-energy range sensor arrangement structure (100), in accordance of an embodiment of the invention. As shown by FIG. 1, the novel side-by-side dual-energy range sensor arrangement structure (100) comprises a low-energy (LE) pixel array (107) that selectively detects low-energy range photons, and a high-energy (HE) pixel array (109) that selectively detects high-energy range photons, as an object to be scanned by the x-ray detector moves through a detection area (i.e. between 107 and 109), which is monolithically constructed on a single substrate (111). The high-energy (HE) pixel array (109) and the low-energy (LE) pixel array (107) are positioned side by side monolithically on the single substrate (111), which is typically a semiconductor substrate forming a singular semiconductor chip upon fabrication.

Furthermore, the novel side-by-side dual-energy range sensor arrangement structure (100) also includes one or more metal-oxide semiconductor (MOS) devices (105) integrated monolithically on the single substrate (111). In a preferred embodiment of the invention, a signal processing circuitry that produces an electrical signal proportional to a quantity of x-ray photons collected by each pixel over a detector control software-defined signal acquisition time is integrated in the single substrate (111) as a MOS device. Furthermore, in some cases, a time-delayed integrated (TDI) circuitry that delays two or more electrical signals from a plurality of pixels and adds such signals to generate a larger and/or cleaner signal, which is proportional to the quantity of x-ray photons as the object moves through the detection area and forms an x-ray-scanned image of the object, is also monolithically integrated on the single substrate (111) as part of the MOS devices (105). Preferably, the MOS devices (105) are shielded from x-ray radiation from an x-ray source (101) with a dense x-ray shield (103), which may be made of lead or another high-density material suitable for blocking or reducing x-ray radiation exposure to the MOS devices (105).

In the preferred embodiment of the invention, a dual-energy range x-ray detector encapsulating the novel side-by-side dual-energy range sensor arrangement structure (100) comprises a pair of one-dimensional pixel arrays (e.g. 107, 109) physically positioned in parallel to each other, wherein a first pixel array (e.g. 109) selectively detects higher-energy x-ray photons relative to a second pixel array (e.g. 107) among the pair of one-dimensional pixel arrays.

The second pixel array (e.g. 107) is capable of selectively detecting lower-energy x-ray photons relative to the first pixel array (e.g. 109) among the pair of one-dimensional pixel arrays. In addition, the dual-energy range x-ray detector also includes a high-density x-ray shielding (e.g. 103) that sufficiently attenuates x-rays from directly impinging on metal oxide semiconductor (MOS) devices (e.g. 105) near the first pixel array and the second pixel array, wherein a straight-line x-ray path emanating from a source of the x-rays (e.g. 101) intersects the first pixel array and the second pixel array in the pair of one-dimensional pixel arrays simultaneously, and wherein the x-rays not attenuated by, scattered by, or intersected with the x-ray shielding (e.g. 103) also does not impinge on the MOS devices (e.g. 105) near the pair of one-dimensional pixels arrays. As an optional element, a filter (e.g. 209 in FIG. 2) may be placed in front of the first pixel array to improve x-ray scan quality and reduce undesirable noise signatures. In the preferred embodiment, the filter is a metallic apparatus made at least in part from gold, silver, copper, tin, or a combination thereof.

Figure 2:
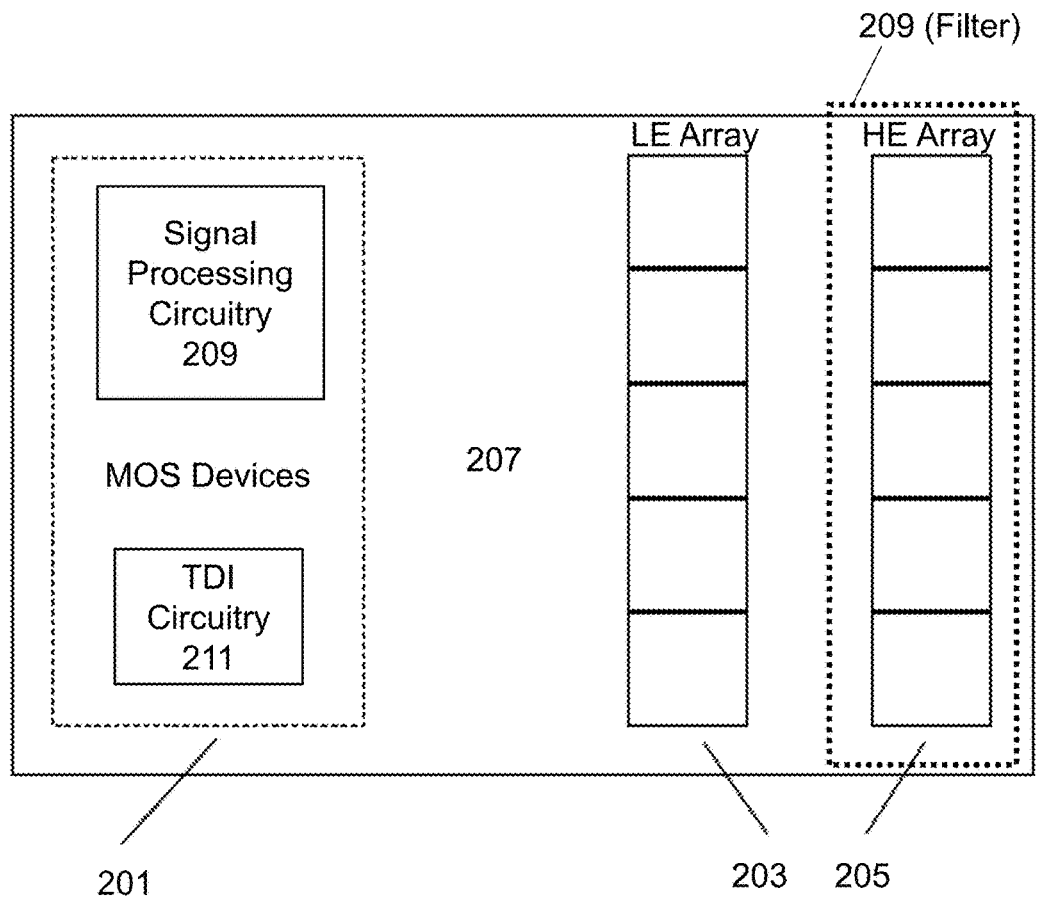
FIG. 2 shows a top view of a pair (i.e. two-row) of pixel arrays with its associated MOS devices as parts of the novel side-by-side dual-energy range sensor arrangement structure, in accordance with an embodiment of the invention.

FIG. 2 shows a top view (200) of a pair (i.e. two-row) of pixel arrays (203, 205) with its associated MOS devices (201) as parts of the novel side-by-side dual-energy range sensor arrangement structure (207), in accordance with an embodiment of the invention. The novel side-by-side dual-energy range sensor arrangement structure (207) includes a detector area formed between or near the pair of pixel arrays (203, 205) on a geometric plane oriented to receive x-ray photons emanating from an x-ray source.

As shown in FIG. 2, a first pixel array (i.e. "HE array" (203)) selectively collects a first subset of the x-ray photons with a first x-ray energy spectral response different from a second subset of the x-ray photons exhibiting a second x-ray energy spectral response, which is selectively collected by a second pixel array (i.e. "LE array" (205)) among the pair of pixel arrays (203, 205). Furthermore, in this embodiment of the invention, a signal processing circuitry (209) is integrated monolithically to the same base substrate as pixel array components. The signal processing circuitry (209) produces an electrical signal proportional to a quantity of x-ray photons collected by each pixel over a signal acquisition time, which may be specified and/or adjusted by a detector control software that can be embedded or operatively connected to the signal processing circuitry (209).

Moreover, a time-delayed integrated (TDI) circuitry (211) can also be integrated monolithically to the same base substrate as the pixel array components. The TDI circuitry (211) is configured to delay two or more electrical signals from two or more pixels, and adds the two or more electrical signals to generate a larger or cleaner signal proportional to the quantity of x-ray photons as the scanned object moves transversely between the x-ray source and the detector area. Subsequently, a plurality of added signals from the TDI circuitry (211) can synthesize an x-ray scanned image of the object that moved through the detector area. Typically, the signal processing circuitry (209) and the TDI circuitry (211) are MOS devices (201), which benefit from x-ray radiation shielding with a dedicated radiation shield that specifically covers an area above or below the MOS devices (201). In some instances, the MOS devices (201) are made of CMOS field-effect transistors, while in other instances, other types of transistors are utilized for implementing the signal processing circuitry (209), the TDI circuitry (211), and/or other circuitry related to the dual-energy range x-ray detector.

In one embodiment of the invention, the pixels in the pixel arrays contain photodiodes or other photoelements resilient to radiation damage for improving the overall reliability of the x-ray detector, as the pixel arrays are frequently exposed to x-ray object-scanning activities. Furthermore, in some embodiments of the invention, pixels in the pixel arrays contain scintillator material that lowers energy levels of higher-energy photons, or converts the higher-energy photons to visible photons that are readily detectable by photodiodes.

Figure 3:
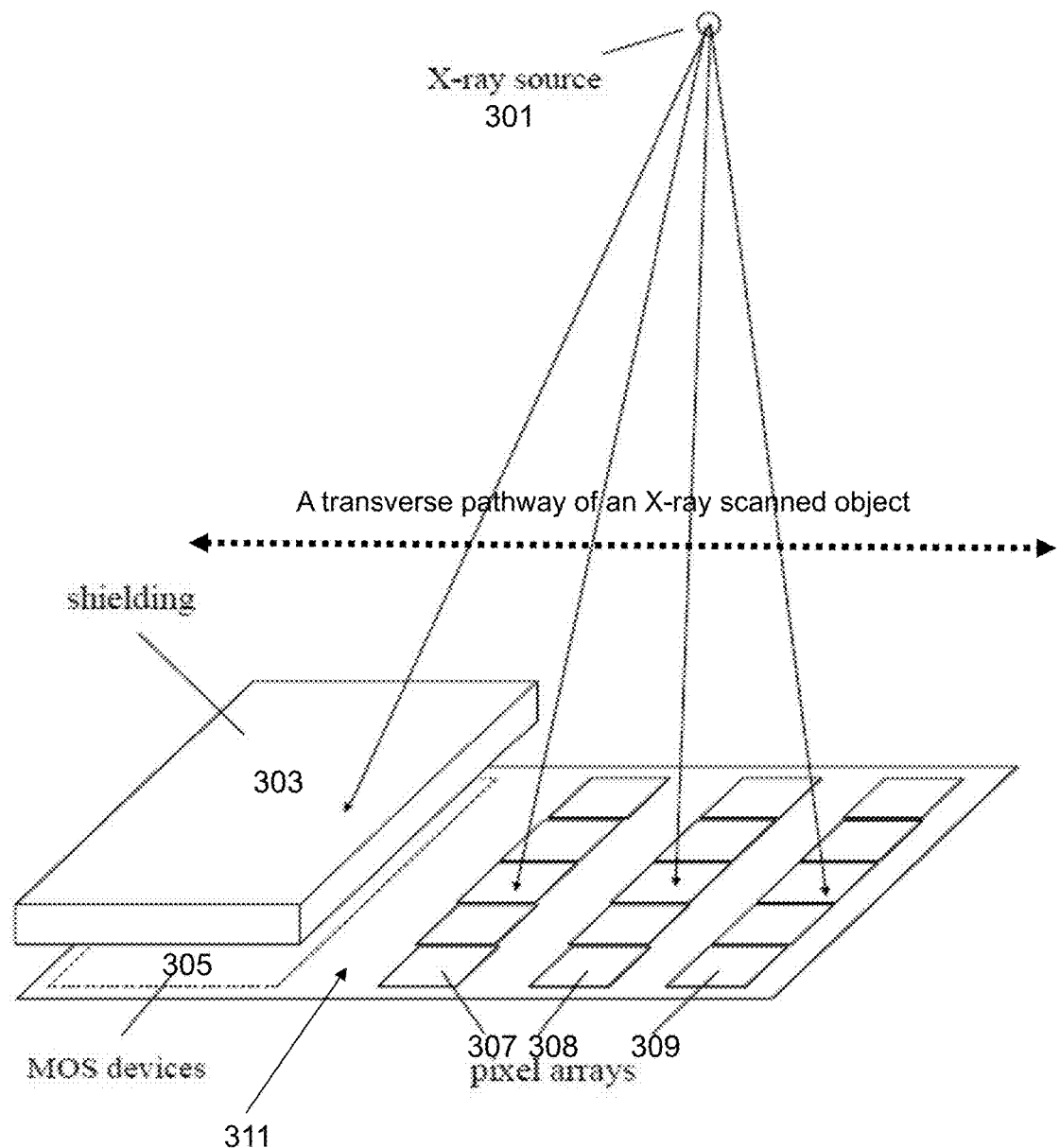
FIG. 3 shows a novel side-by-side multi-energy range sensor arrangement structure receiving an x-ray energy, in accordance with an embodiment of the invention.

FIG. 3 shows a novel side-by-side multi-energy range sensor arrangement structure (300) receiving an x-ray energy, in accordance with an embodiment of the invention. As shown by FIG. 3, the novel side-by-side multi-energy range sensor arrangement structure (300) comprises a plurality of pixel arrays (307, 308, 309). The plurality of pixel arrays includes low-energy (LE) pixel arrays that selectively detects low-energy range photons, and a plurality of high-energy (HE) pixel arrays that selectively detects high-energy range photons, as an object to be scanned by the x-ray detector moves through a detection area (i.e. between 307 and 309), which is monolithically constructed on a single substrate (311). The plurality of pixel arrays (307, 308, 309), which may be designed to respond to different multi-energy levels, is positioned side by side monolithically on the single substrate (311), which is typically a semiconductor substrate forming a singular semiconductor chip upon fabrication.

Furthermore, the novel side-by-side multi-energy range sensor arrangement structure (300) also includes one or more metal-oxide semiconductor (MOS) devices (305) integrated monolithically on the single substrate (311). In a preferred embodiment of the invention, a signal processing circuitry that produces an electrical signal proportional to a quantity of x-ray photons collected by each pixel over a detector control software-defined signal acquisition time is integrated in the single substrate (311) as a MOS device.

Moreover, in some cases, a time-delayed integrated (TDI) circuitry that delays two or more electrical signals from a plurality of pixels and adds such signals to generate a larger and/or cleaner signal, which is proportional to the quantity of x-ray photons as the object moves through the detection area and forms an x-ray-scanned image of the object, is also monolithically integrated on the single substrate (311) as part of the MOS devices (305). Preferably, the MOS devices (305) are shielded from x-ray radiation from an x-ray source (301) with a dense x-ray shield (303), which may be made of lead or another high-density material suitable for blocking or reducing x-ray radiation exposure to the MOS devices (305).

In this embodiment of the invention, a multi-energy range x-ray detector comprises a detector area (e.g. between 307 and 309) located on a monolithic substrate (e.g. 311), and a plurality of x-ray-detecting pixel arrays (e.g. 307, 308, 309) located on the detector area in a horizontally-parallel arrangement to each other. Each pixel array has a distinct spectral response specialized to detect a particular range of x-ray photons. Preferably, the horizontally-parallel arrangement is perpendicular to a straight-line x-ray path emanating from an x-ray source (e.g. 301) positioned above or below the detector area.

Furthermore, the multi-energy range x-ray detector also includes one or more metal-oxide semiconductor (MOS) devices (e.g. 305) monolithically integrated into the monolithic substrate (e.g. 311). The MOS devices receive detection signals from pixels in the plurality of x-ray-detecting pixel arrays, and the MOS device is sufficiently apart from the plurality of x-ray-detecting pixel arrays to be shielded from an x-ray radiation even within the detector area. Additionally, the multi-energy range x-ray detector also incorporates an x-ray shielding unit positioned above or below the MOS device to provide a selective x-ray radiation shielding within the detector area.

Figure 4:
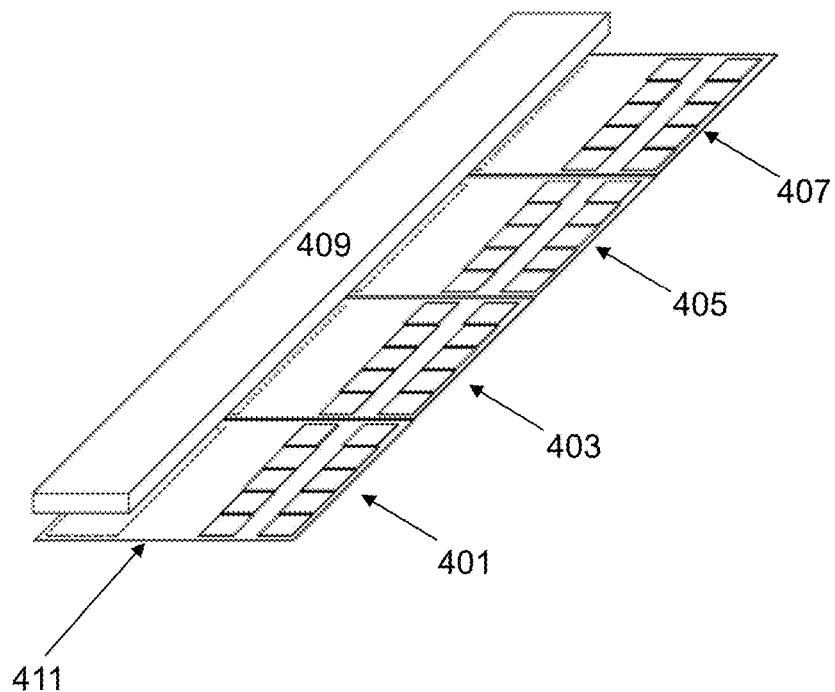
FIG. 4 shows a novel tile formation created from a novel side-by-side dual-energy range sensor arrangement structure, in accordance with an embodiment of the invention.

FIG. 4 shows a novel tile formation (400) created from a novel side-by-side dual-energy range sensor arrangement structure, in accordance with an embodiment of the invention. In this novel tile formation (400) each one-dimensional x-ray-detecting pixel array comprises a plurality of smaller and separate pixel arrays (401, 403, 405, 407) that are aligned and tiled together in a lateral, arced, staggered, or overlapped arrangement to form a complete one-dimensional pixel array. In context of the novel tile formation (400) illustrated in FIG. 4, there are a pair of one-dimensional pixel arrays lined up in two columns, each column represented by aligned tiles of one-dimensional pixel arrays.

In a preferred embodiment of the invention, the aligned tiles are modular and scalable for defining the detector area, with the number of pixels in each column adjustable by adding or subtracting a tile from the novel side-by-side dual energy-range sensor arrangement structure. In some embodiments, the combined tiles may be constructed in a monolithic singular substrate (411). In other embodiments, the combined tiles may be constructed separately in separate substrates and subsequently assembled together. Furthermore, as also shown in FIG. 4, a radiation shield (409) may protect signal processing circuitry and other MOS devices underneath the shielded area.

Figure 5:
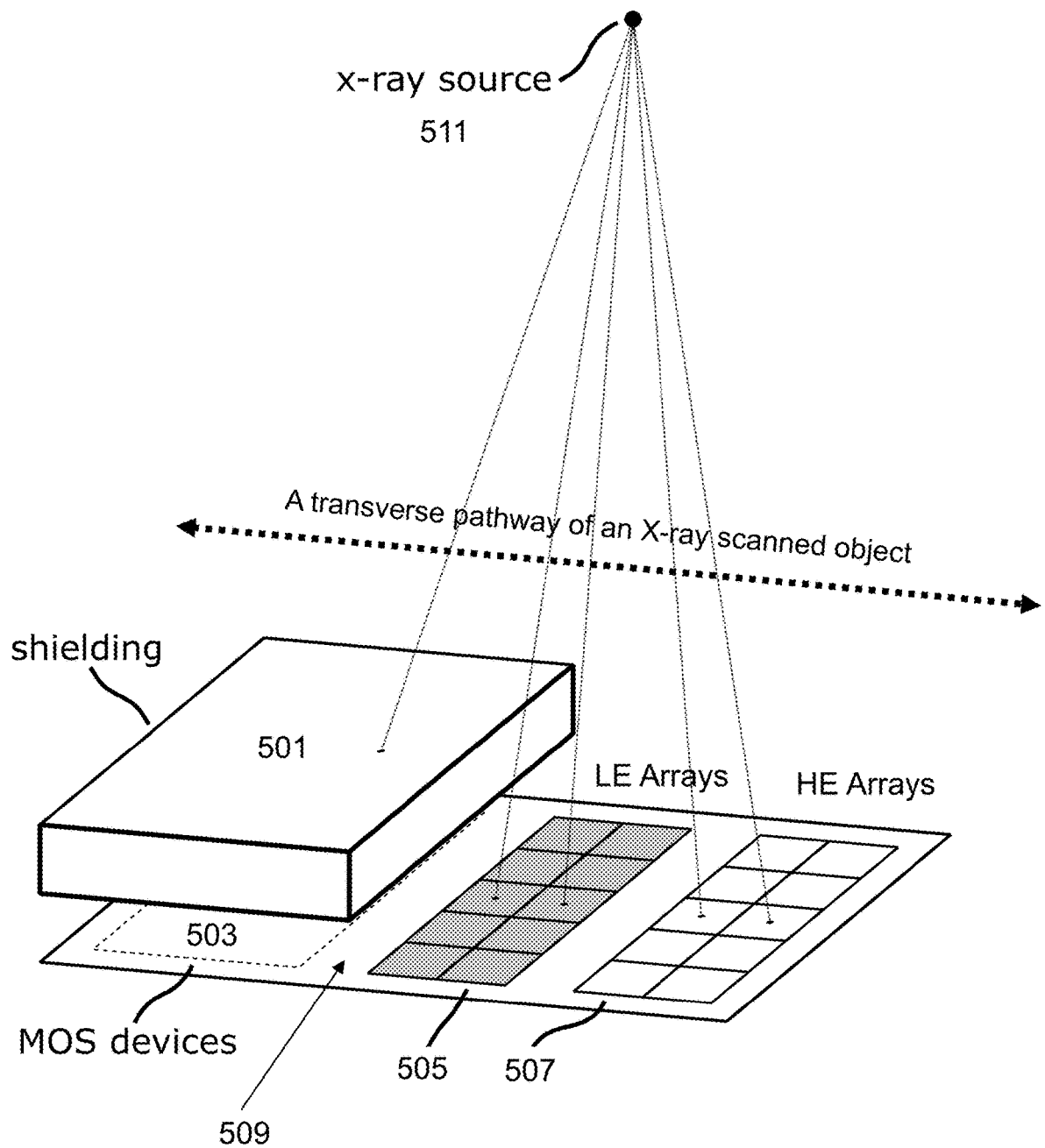
FIG. 5 shows a novel side-by-side dual-energy range sensor arrangement structure utilizing a TDI sensor, in accordance with an embodiment of the invention.

FIG. 5 shows a novel side-by-side dual-energy range sensor arrangement structure (500) utilizing a TDI sensor, in accordance with an embodiment of the invention. As shown by FIG. 5, the novel side-by-side dual-energy range sensor arrangement structure (500) comprises a plurality of low-energy (LE) pixel arrays (505) that selectively detects low-energy range photons, and a plurality of high-energy (HE) pixel arrays (507) that selectively detects high-energy range photons, as an object to be scanned by the x-ray detector moves through a detection area, which is monolithically constructed on a single substrate (509). As shown in FIG. 5, an x-ray source (511) is typically located above the detection area. The high-energy (HE) pixel arrays (507) and the low-energy (LE) pixel arrays (505) are positioned side by side monolithically on the single substrate (509), which is typically a semiconductor substrate forming a singular semiconductor chip upon fabrication.

Furthermore, the novel side-by-side dual-energy range sensor arrangement structure (500) also includes one or more metal-oxide semiconductor (MOS) devices (503) integrated monolithically on the single substrate (509). In a preferred embodiment of the invention, a signal processing circuitry that produces an electrical signal proportional to a quantity of x-ray photons collected by each pixel over a detector control software-defined signal acquisition time is integrated in the single substrate (509) as a MOS device.

Importantly, in this embodiment, a time-delayed integrated (TDI) circuitry that delays two or more electrical signals from a plurality of pixels and adds such signals to generate a larger and/or cleaner signal, which is proportional to the quantity of x-ray photons as the object moves through the detection area and forms an x-ray-scanned image of the object, is also monolithically integrated on the single substrate (509) as part of the MOS devices (503). As illustrated in FIG. 5, the TDI circuitry is capable of ignoring a first set of pixel arrays (505) for a specified period, while reading out a second set of pixel arrays (507) during that specified period to selectively add and generate a larger and/or cleaner signal. Furthermore, as shown in this embodiment, the MOS devices (503) are shielded from x-ray radiation from an x-ray source with a dense x-ray shield (501), which may be made of lead or another high-density material suitable for blocking or reducing x-ray radiation exposure to the MOS devices (503).

Figure 6:
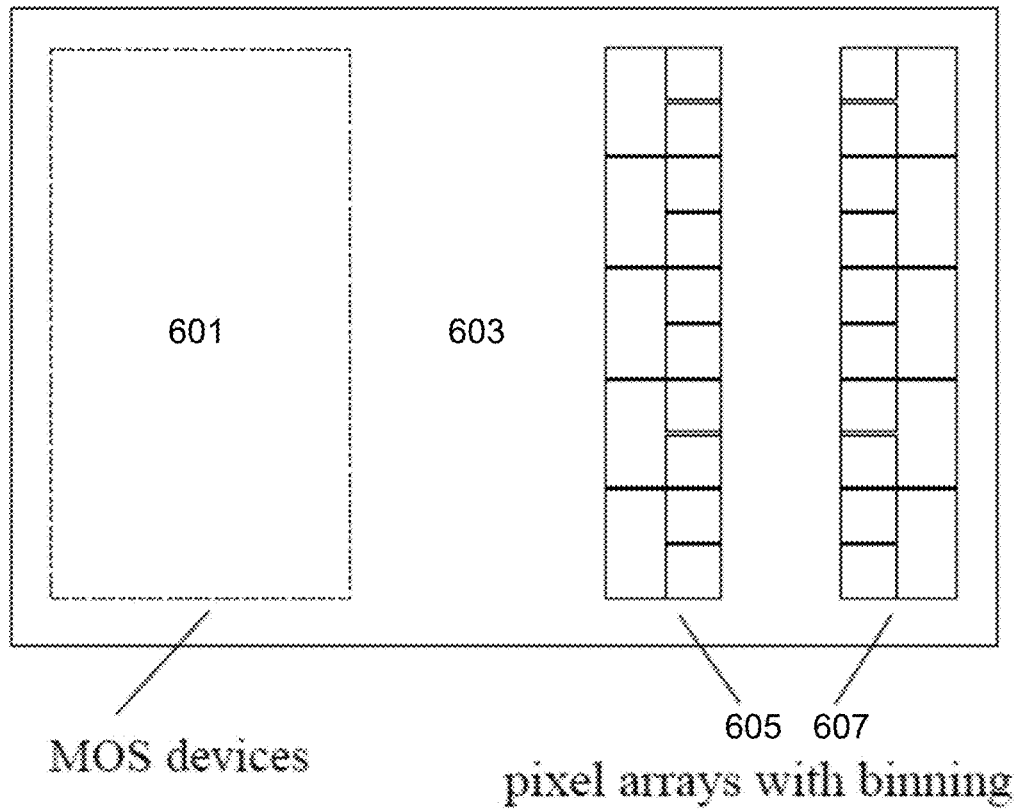
FIG. 6 shows a novel side-by-side dual-energy range sensor arrangement structure with pixel binning for various pixel sizes, in accordance with an embodiment of the invention.

FIG. 6 shows a novel side-by-side dual-energy range sensor arrangement structure (600) with pixel binning for various pixel sizes, in accordance with an embodiment of the invention Similar to other embodiments previously presented in other figures, the novel side-by-side dual-energy range sensor arrangement structure (600) contains multiple pixel arrays side by side, and monolithically integrates the multiple pixel arrays and MOS devices (601) in a single semiconductor substrate (603).

However, in this embodiment, each x-ray-detecting pixel array column has a particular pixel size that may be different from a pixel size of another x-ray-detecting pixel array located nearby. For example, a first pixel array column (605) contains various pixel sizes, and a second pixel array column (607) also contains various pixel sizes. In some embodiments of the invention, the first pixel array column (605) and the second pixel array column (607) may form a symmetry of various pixels, as shown in FIG. 6. In other embodiments of the invention, the first pixel array column (605) and the second pixel array column (607) may be asymmetrical or random in their individual arrangements within each column.

Figure 7:
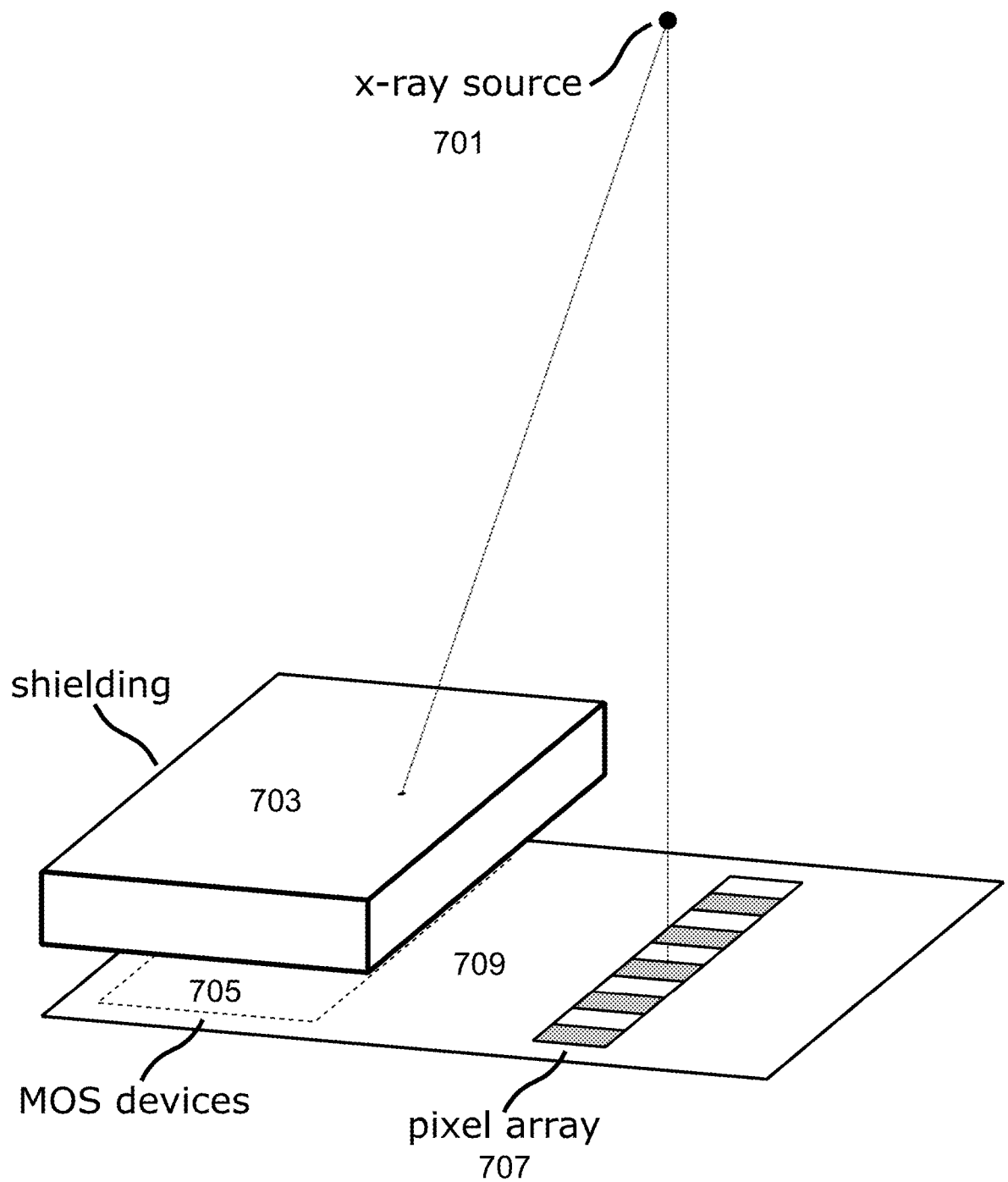
FIG. 7 shows an example of an interdigitated high-energy (HE) and low-energy (LE) pixel structure, in accordance with an embodiment of the invention.

FIG. 7 shows a novel interdigitated dual-energy range sensor arrangement structure (700), in accordance with an embodiment of the invention. As shown by FIG. 7, the novel interdigitated dual-energy range sensor arrangement structure (700) comprises an array of low-energy (LE) pixels that selectively detects low-energy range photons, and an array of high-energy (HE) pixels that selectively detects high-energy range photons, as an object to be scanned by the x-ray detector and an x-ray source (701) moves through a detection area, which is monolithically constructed on a single substrate (709). The high-energy (HE) pixel arrays and the low-energy (LE) pixel arrays are positioned interdigitated (707) monolithically on the single substrate (709), which is typically a semiconductor substrate forming a singular semiconductor chip upon fabrication.

In the resulting raw images, high-energy (HE) pixels and low-energy (LE) pixels are not aligned with each other. Each HE pixel does not have a matching LE pixel, and vice versa. To overcome this, an interpolation program, which may be a pure software or an embedded software in a hardware device, interpolates two adjacent LE pixels to create a new LE pixel matching a particular HE pixel. Likewise, two adjacent HE pixels would be interpolated to create a new HE pixel matching a particular LE pixel. This is repeated on each unmatched pixel. The set of interpolated pixel data are combined with the set of actual pixel data to provide a pair of augmented data arrays with twice the number of pixels, thus twice the resolution. The augmented HE and LE data arrays are then used for the material discrimination.

Alternatively, it is not necessary to double the resolution. Software may just be used to perform interpolation to correct for the misalignment between HE and LE pixels without doubling the number of pixels. This is equivalent to doubling the number of pixels through interpolation and then averaging interpolated pixel data with actual pixel data to create a set of aligned HE and LE pixel data.

Furthermore, the novel interdigitated dual-energy range sensor arrangement structure (700) also includes one or more metal-oxide semiconductor (MOS) devices (705) integrated monolithically on the single substrate (709). In a preferred embodiment of the invention, a signal processing circuitry that produces an electrical signal proportional to a quantity of x-ray photons collected by each pixel over a detector control software-defined signal acquisition time is integrated in the single substrate (709) as a MOS device.

Furthermore, as shown in this embodiment, the MOS devices (705) are shielded from x-ray radiation from an x-ray source with a dense x-ray shield (703), which may be made of lead or another high-density material suitable for blocking or reducing x-ray radiation exposure to the MOS devices (705).

Figure 8:
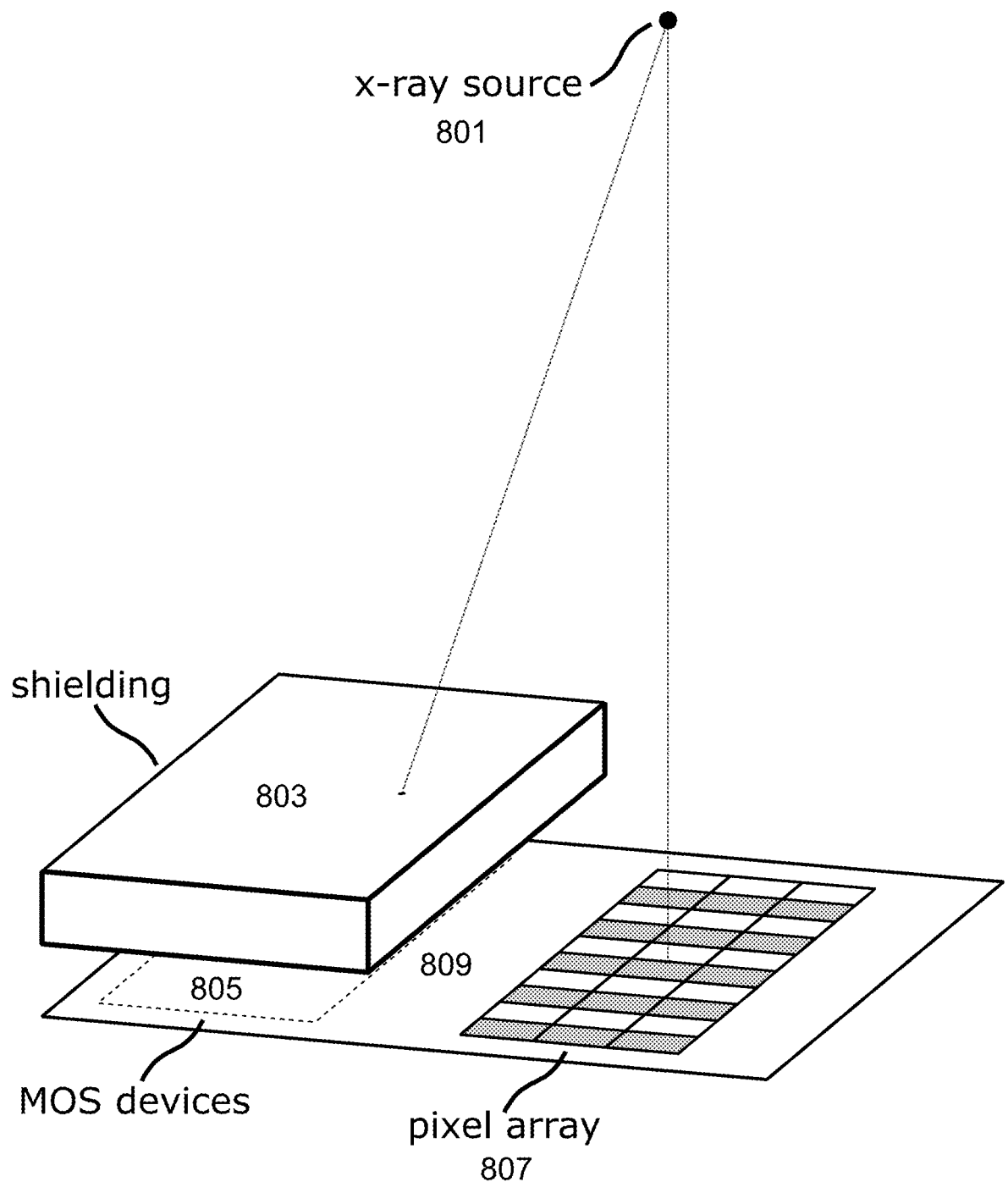
FIG. 8 shows an example of an interdigitated HE and LE pixel structure in a TDI array, in accordance with an embodiment of the invention.

FIG. 8 shows a novel interdigitated dual-energy range sensor arrangement structure (800) utilizing a TDI sensor, in accordance with an embodiment of the invention. As shown by FIG. 8, the novel interdigitated dual-energy range sensor arrangement structure (800) comprises an array of low-energy (LE) pixels that selectively detects low-energy range photons, and an array of high-energy (HE) pixels that selectively detects high-energy range photons, as an object to be scanned by the x-ray detector and an x-ray source (801) moves through a detection area, which is monolithically constructed on a single substrate (809). The high-energy (HE) pixel arrays and the low-energy (LE) pixel arrays are positioned interdigitated (807) monolithically on the single substrate (809), which is typically a semiconductor substrate forming a singular semiconductor chip upon fabrication.

HE and LE arrays are TDI structures that collects greater signals (as in the FIG. 5 embodiment). In the resulting raw images, high-energy (HE) pixels and low-energy (LE) pixels are not aligned with each other. Each HE pixel does not have a matching LE pixel, and vice versa. To overcome this problem, a interpolation program interpolates two adjacent LE pixels to match a particular HE pixel. Likewise, two adjacent HE pixels would be interpolated to match a particular LE pixel. This is repeated on each unmatched pixel. The set of interpolated pixel data are combined with the set of actual pixel data to provide a pair of augmented data arrays with twice the number of pixels, resulting in doubling of the resolution. The augmented HE and LE data arrays are then used for the material discrimination.

Alternatively, it may not be necessary to double the resolution. Software may just be used to perform interpolation to correct for the misalignment between HE and LE pixels without doubling the number of pixels. This is equivalent to doubling the number of pixels through interpolation and then averaging interpolated pixel data with actual pixel data to create a set of aligned HE and LE pixel data.

Furthermore, the novel interdigitated dual-energy range sensor arrangement structure (800) also includes one or more metal-oxide semiconductor (MOS) devices (805) integrated monolithically on the single substrate (809). In a preferred embodiment of the invention, a signal processing circuitry that produces an electrical signal proportional to a quantity of x-ray photons collected by each pixel over a detector control software-defined signal acquisition time is integrated in the single substrate (809) as a MOS device.

Importantly, in this embodiment, a time-delayed integrated (TDI) circuitry that delays two or more electrical signals from a plurality of pixels and adds such signals to generate a larger and/or cleaner signal, which is proportional to the quantity of x-ray photons as the object moves through the detection area and forms an x-ray-scanned image of the object, is also monolithically integrated on the single substrate (809) as part of the MOS devices (805). Furthermore, as shown in this embodiment, the MOS devices (805) are shielded from x-ray radiation from an x-ray source with a dense x-ray shield (803), which may be made of lead or another high-density material suitable for blocking or reducing x-ray radiation exposure to the MOS devices (805).

Figure 9:
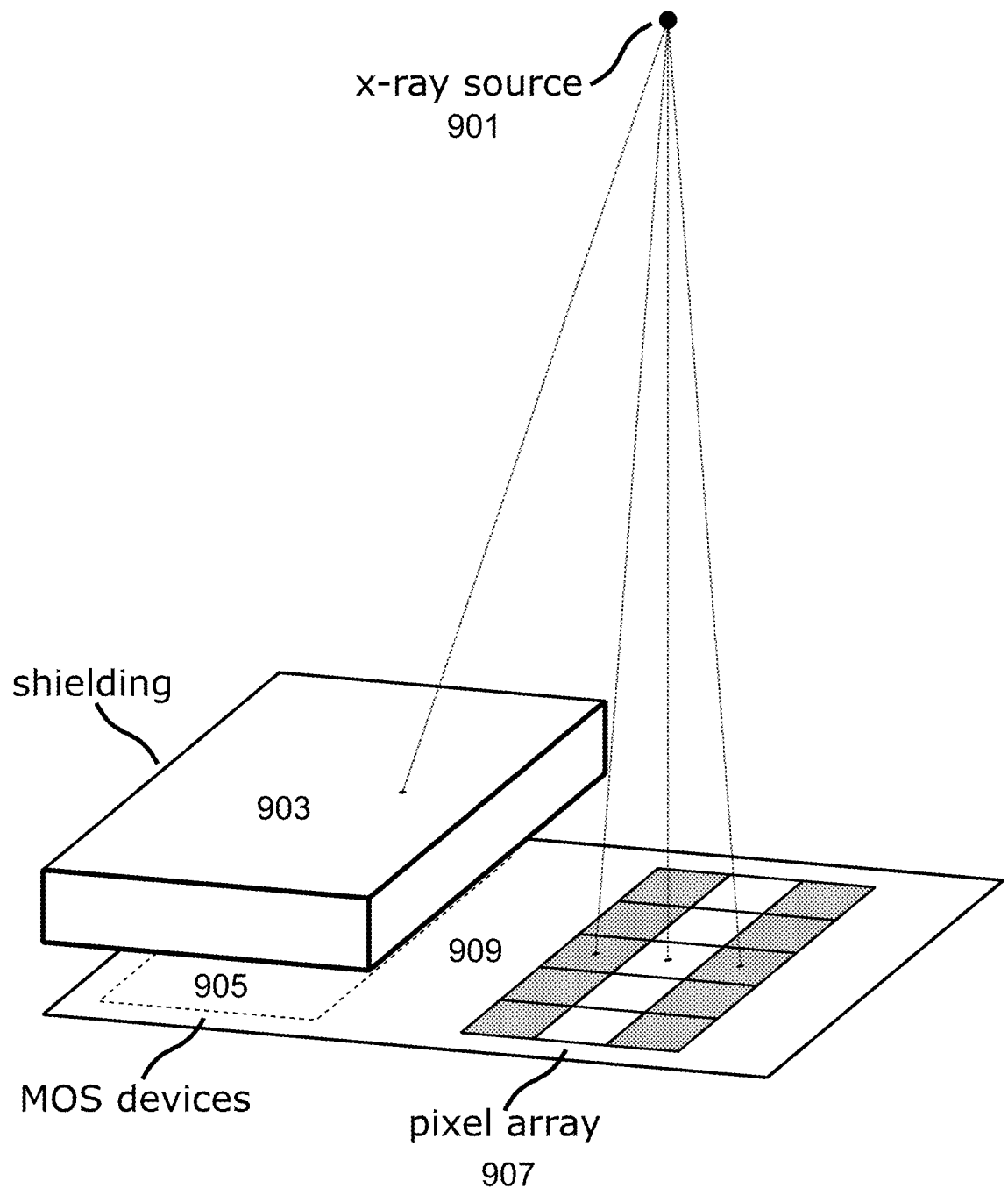
FIG. 9 shows an example of a common centroid "LE/HE/LE" TDI array structure, in accordance with an embodiment of the invention.

FIG. 9 shows a novel dual-energy range sensor structure (900) with a common-centroid pixel arrangement (907) utilizing a TDI sensor, in accordance with an embodiment of the invention. As shown by FIG. 9, the novel LE/HE/LE common-centroid dual-energy range sensor arrangement structure (900) comprises two arrays of low-energy (LE) pixels that selectively detects low-energy range photons, and an array of high-energy (HE) pixels that selectively detects high-energy range photons, as an object to be scanned by the x-ray detector and an x-ray source (901) moves through a detection area, which is monolithically constructed on a single substrate (911). The high-energy (HE) pixel array and the low-energy (LE) pixel arrays are positioned with a common centroid monolithically on the single substrate (909), which is typically a semiconductor substrate forming a singular semiconductor chip upon fabrication.

The center row of pixels contains HE pixels. It is surrounded by two rows of LE pixels. The HE and LE arrays have a common centroid, that is, their center of mass are identical. The same is true for each HE pixel and its two corresponding LE pixels. The TDI function can be utilized to ensure alignment between HE and LE signals. As an object is scanned across the LE/HE/LE arrays, it first encounters the leading LE array. The first LE signal is collected and stored. As it proceeds to the HE array, the HE signal is collected. This HE signal can be outputted and stored digitally or can be stored in an analog form. Finally, when the object gets to the trailing LE array, the second LE signal is collected. This first stored LE signal is then added to the second LE signal in a TDI fashion for a greater signal. The combined LE signal is then outputted. If the HE signal has been stored in an analog form, then it is also outputted and both HE and LE signals are processed for material discrimination. If the HE signal was already stored in a digital form, both HE and LE signals are then processed for material discrimination.

The common centroid of this embodiment reduces the effect of misalignment that might result from uncontrolled motion and x-ray misalignments because misalignments will typically create errors that are balanced for the two LE pixels on opposing sides of a middle HE pixel. When the signals are combined, the errors typically cancel each other. This particular embodiment also benefits from increased LE signal. Compared to a stacked configuration, this HE signal is already larger than the attenuated HE signal of the stacked configuration. Therefore, this arrangement has increased SNR for both LE and HE arrays. Additional stages may be added to increase the TDI signal.

Furthermore, the novel common-centroid dual-energy range sensor arrangement structure (900) also includes one or more metal-oxide semiconductor (MOS) devices (905) integrated monolithically on the single substrate (909). In a preferred embodiment of the invention, a signal processing circuitry that produces an electrical signal proportional to a quantity of x-ray photons collected by each pixel over a detector control software-defined signal acquisition time is integrated in the single substrate (909) as a MOS device.

Importantly, in this embodiment, a time-delayed integrated (TDI) circuitry that delays two or more electrical signals from a plurality of pixels and adds such signals to generate a larger and/or cleaner signal, which is proportional to the quantity of x-ray photons as the object moves through the detection area and forms an x-ray-scanned image of the object, is also monolithically integrated on the single substrate (909) as part of the MOS devices (905). Furthermore, as shown in this embodiment, the MOS devices (905) are shielded from x-ray radiation from an x-ray source with a dense x-ray shield (903), which may be made of lead or another high-density material suitable for blocking or reducing x-ray radiation exposure to the MOS devices (905).

Figure 10:
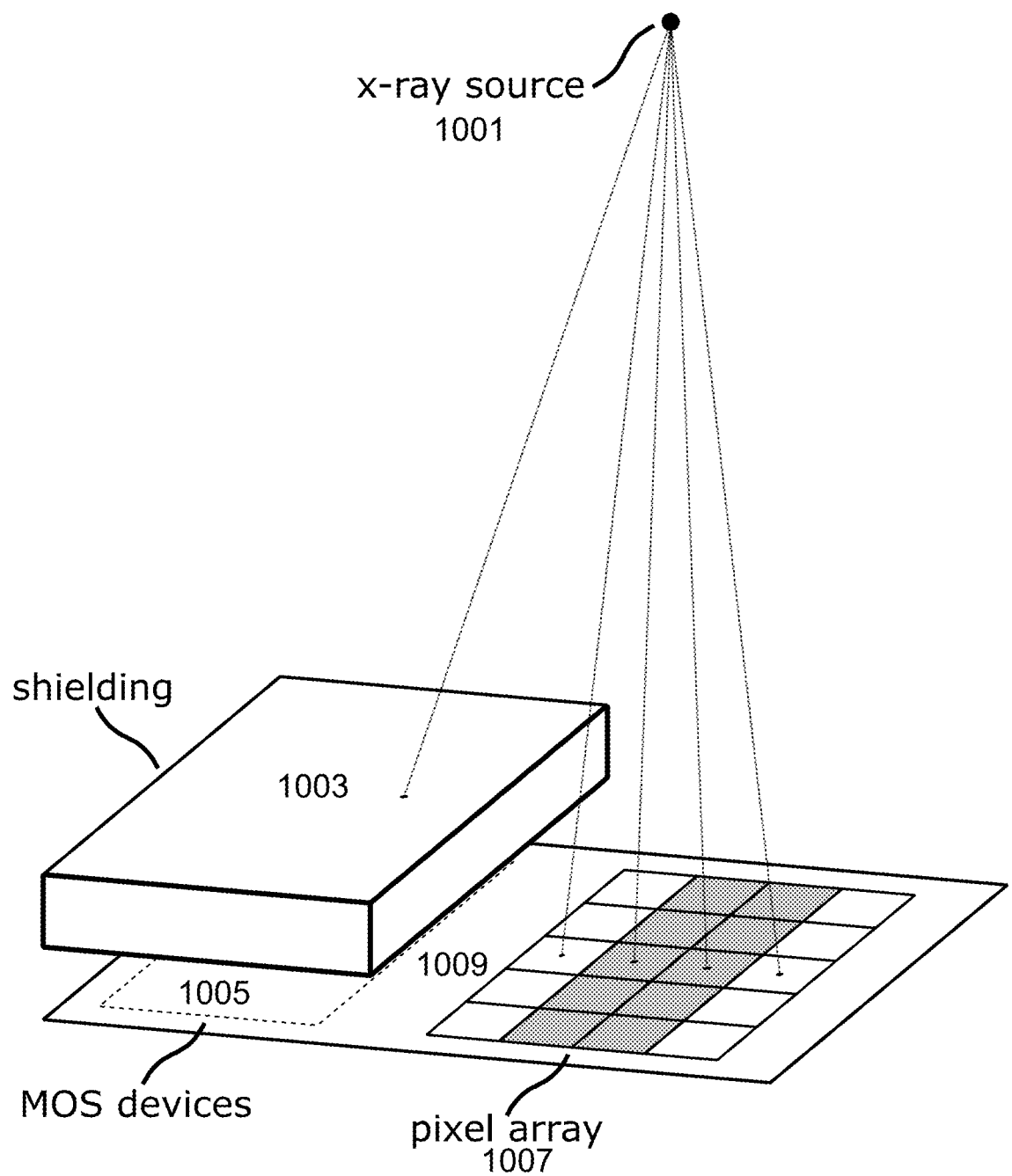
FIG. 10 shows another example of a common centroid "HE/LE/HE" TDI array structure, in accordance with an embodiment of the invention.

FIG. 10 shows a novel dual-energy range sensor structure (1000) with a common-centroid pixel arrangement (1007) utilizing a TDI sensor, in accordance with an embodiment of the invention. As shown by FIG. 10, the novel HE/LE/HE common-centroid dual-energy range sensor arrangement structure (1000) comprises two arrays of low-energy (LE) pixels that selectively detects low-energy range photons, and two arrays of high-energy (HE) pixels that selectively detects high-energy range photons emitted from an x-ray source (1001), as an object to be scanned by the x-ray detector moves through a detection area, which is monolithically constructed on a single substrate (1009). The high-energy (HE) pixel arrays and the low-energy (LE) pixel arrays are positioned with a common centroid monolithically on the single substrate (1009), which is typically a semiconductor substrate forming a singular semiconductor chip upon fabrication.

This HE/LE/HE common-centroid dual-energy range sensor arrangement structure is one of several variations of an embodiment previously described in FIG. 9. Two central rows or columns of pixels contains LE pixels. They are surrounded by two rows or columns of HE pixels. The HE and LE arrays have a common centroid, which means their centers of mass are identical. The same is true for each pair of corresponding HE pixels and their two corresponding LE pixels. The TDI function can be used to assure alignment between HE and LE signals. As an object is scanned across the HE/LE/HE arrays, it will first encounter the leading HE array. The HE signal is collected and stored. As the object proceeds to the first LE array, its related signals is collected from the first LE array. Next, the second LE signal is collected and added to a delayed first LE signal. The added signals are stored together. Finally, when the object reaches the trailing HE array, the second HE signal is collected and added to a delayed first HE signal. Both HE and LE combined signals are outputted and processed for material discrimination.

Compared to the previous embodiment of FIG. 9, this particular embodiment benefits from an increased HE signal. The increased HE signal is beneficial, for example, if the HE signal is reduced by design choices that traded off HE signal for other considerations, such as manufacturing simplicity or lower cost. Additional stages may be added to increase the TDI signal. The inner arrays of this and the previous common-centroid embodiments may have superior alignment than the outer arrays, due to alignment mismatch from uncontrolled motion or from x-ray misalignment. This embodiment favors better alignment on the HE signal. The previous embodiment described in conjunction with FIG. 9 favors better alignment on the LE signal. Different image processing algorithms may favor one over the other.

Furthermore, the novel common-centroid dual-energy range sensor arrangement structure (1000) also includes one or more metal-oxide semiconductor (MOS) devices (1005) integrated monolithically on the single substrate (1009). In a preferred embodiment of the invention, a signal processing circuitry that produces an electrical signal proportional to a quantity of x-ray photons collected by each pixel over a detector control software-defined signal acquisition time is integrated in the single substrate (1009) as a MOS device.

Importantly, in this embodiment, a time-delayed integrated (TDI) circuitry that delays two or more electrical signals from a plurality of pixels and adds such signals to generate a larger and/or cleaner signal, which is proportional to the quantity of x-ray photons as the object moves through the detection area and forms an x-ray-scanned image of the object, is also monolithically integrated on the single substrate (1009) as part of the MOS devices (1005). Furthermore, as shown in this embodiment, the MOS devices (1005) are shielded from x-ray radiation from an x-ray source with a dense x-ray shield (1003), which may be made of lead or another high-density material suitable for blocking or reducing x-ray radiation exposure to the MOS devices (1005).

Figure 11:
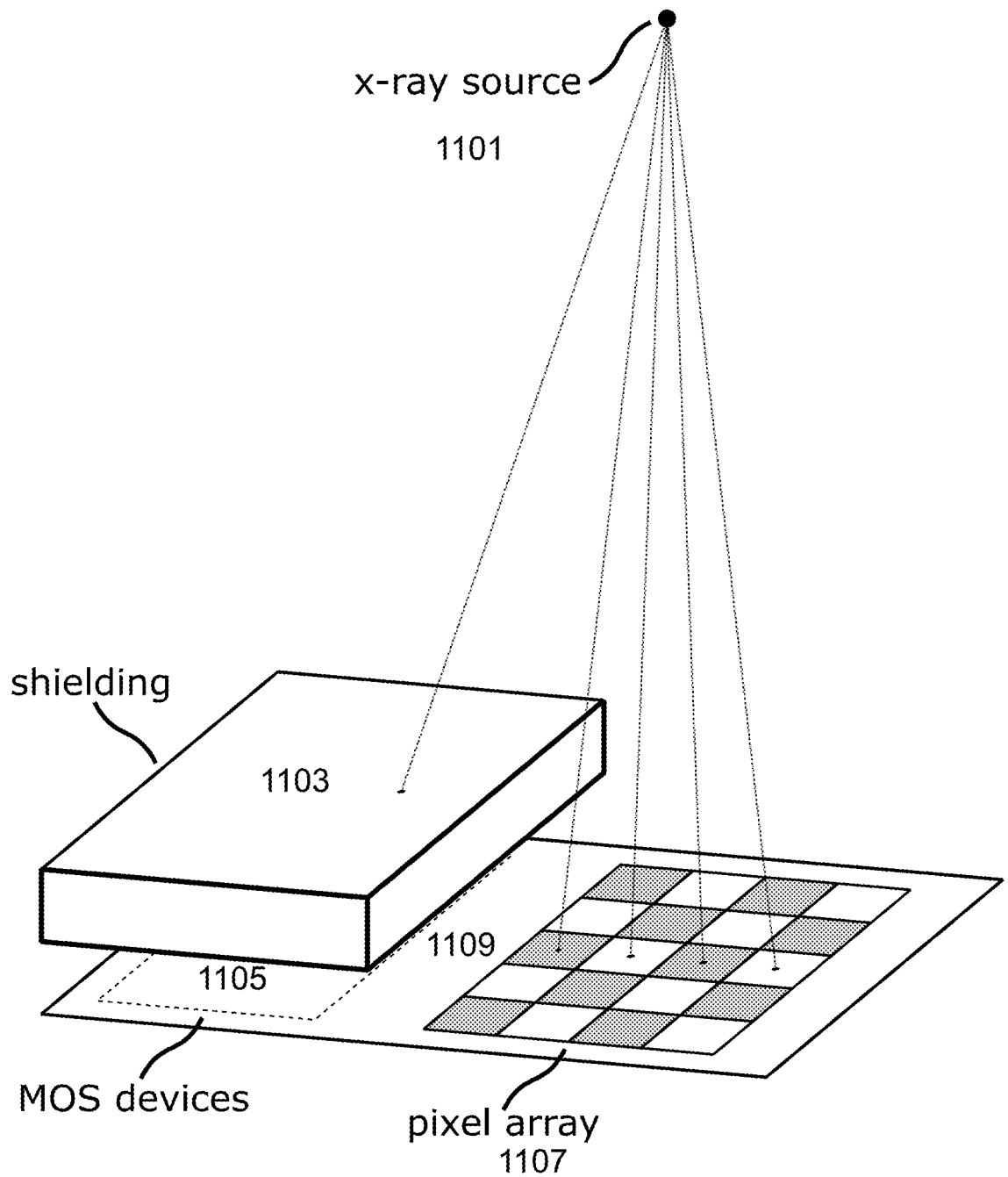
FIG. 11 shows an example of a common centroid checkered TDI array, in accordance with an embodiment of the invention.

FIG. 11 shows a novel dual-energy range sensor structure (1100) with a checkboard common-centroid pixel arrangement (1107) utilizing a TDI sensor, in accordance with an embodiment of the invention. As shown by FIG. 11, the novel checkboard common-centroid dual-energy range sensor arrangement structure (1100) comprises low-energy (LE) pixels that selectively detects low-energy range photons, and high-energy (HE) pixels that selectively detects high-energy range photons, as an object to be scanned by the x-ray detector and an x-ray source (1101) moves through a detection area, which is monolithically constructed on a single substrate (1109). The high-energy (HE) pixel array and the low-energy (LE) pixel arrays are positioned in a common-centroid checkboard pattern monolithically on the single substrate (1109), which is typically a semiconductor substrate forming a singular semiconductor chip upon fabrication.

In a checkboard pattern, the HE and LE arrays have a common centroid, which means that their centers of mass are identical. The same is true for the two HE pixels and two LE pixels in each 2-by-2 section of the pixel array. The pixels are read out using a TDI methodology to ensures alignment between HE and LE signals. To ensure full benefits of the common centroid arrangement, each pair of HE columns are averaged and each pair of LE columns are averaged. Alternatively, higher resolution images can be achieved through software interpolation (i.e. similar to the interpolations conducted in embodiments described in FIG. 7 and FIG. 8). Both HE and LE signals are then processed for material discrimination.

The common centroid of this embodiment reduces the effect of misalignment that might result from uncontrolled motion and x-ray misalignments because misalignments will typically create balance-related errors. When the signals are combined, the errors cancel each other. Additional stages may be added to increase the TDI signal.

Furthermore, the novel checkboard dual-energy range sensor arrangement structure (1100) also includes one or more metal-oxide semiconductor (MOS) devices (1105) integrated monolithically on the single substrate (1109). In a preferred embodiment of the invention, a signal processing circuitry that produces an electrical signal proportional to a quantity of x-ray photons collected by each pixel over a detector control software-defined signal acquisition time is integrated in the single substrate (1109) as a MOS device.

Importantly, in this embodiment, a time-delayed integrated (TDI) circuitry that delays two or more electrical signals from a plurality of pixels and adds such signals to generate a larger and/or cleaner signal, which is proportional to the quantity of x-ray photons as the object moves through the detection area and forms an x-ray-scanned image of the object, is also monolithically integrated on the single substrate (1109) as part of the MOS devices (1105). Furthermore, as shown in this embodiment, the MOS devices (1105) are shielded from x-ray radiation from an x-ray source with a dense x-ray shield (1103), which may be made of lead or another high-density material suitable for blocking or reducing x-ray radiation exposure to the MOS devices (1105).

Figure 12:
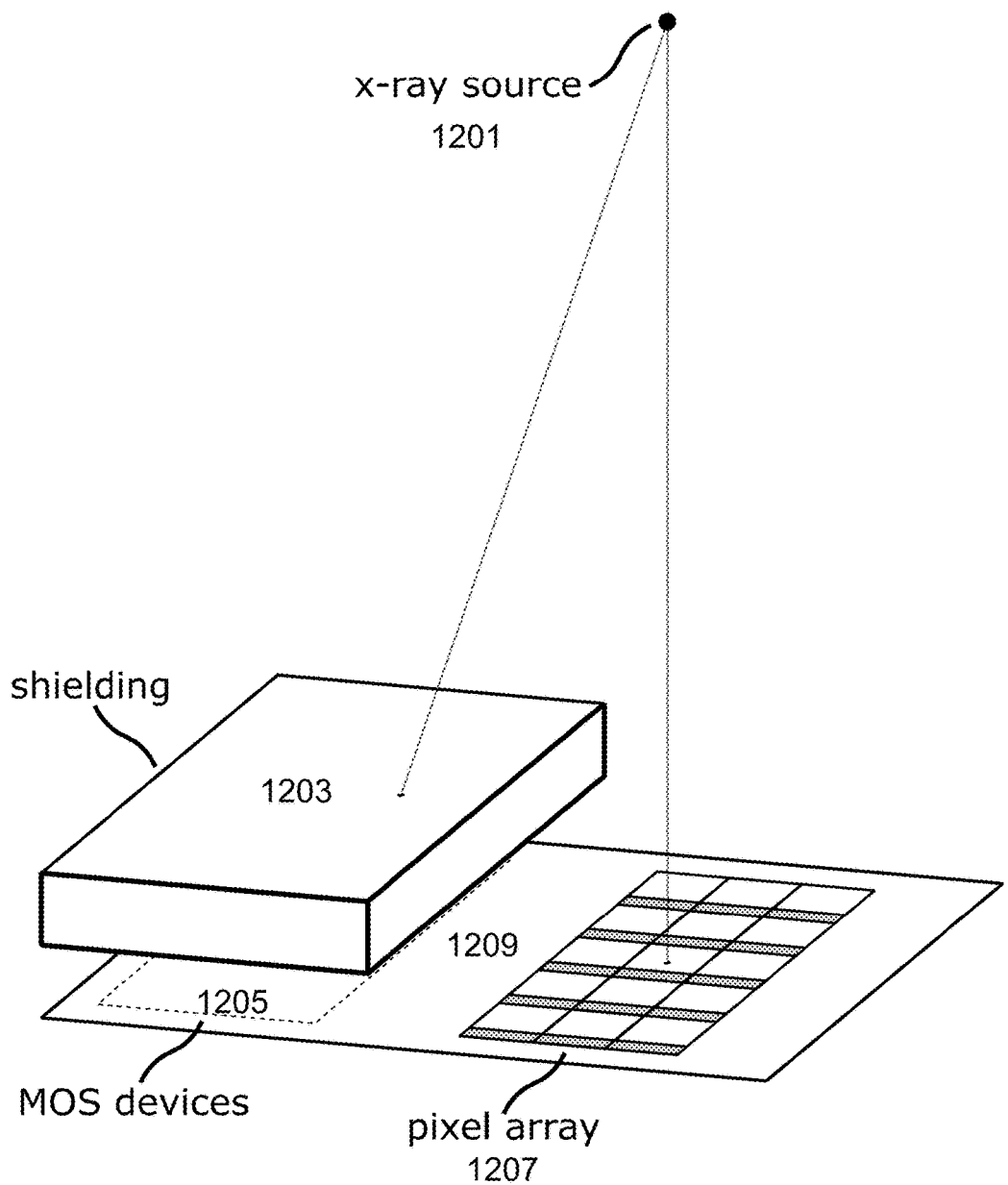
FIG. 12 shows an example of an interdigitated HE and LE pixel structure with uneven pixel sizing in a TDI configuration, in accordance with an embodiment of the invention.

FIG. 12 shows a novel interdigitated dual-energy range sensor arrangement structure (1200) utilizing a TDI sensor, in accordance with an embodiment of the invention. As shown by FIG. 12, the novel interdigitated dual-energy range sensor arrangement structure (1200) comprises an array of low-energy (LE) pixels that selectively detects low-energy range photons, and an array of high-energy (HE) pixels that selectively detects high-energy range photons, as an object to be scanned by the x-ray detector and an x-ray source (1201) moves through a detection area, which is monolithically constructed on a single substrate (1209). The high-energy (HE) pixel arrays and the low-energy (LE) pixel arrays (1207) are positioned interdigitated monolithically on the single substrate (1209), which is typically a semiconductor substrate forming a singular semiconductor chip upon fabrication.

This embodiment differs from that of FIG. 8 in that the HE and LE pixels have unequal areas. This allows to optimize the HE and LE signals where more signal is needed in one or the other energy range or spectrum. For example, if more signal is needed in the HE energy range, the HE pixels can be given greater area, and the HE pixels will have greater signal, but at the deficit of the LE pixels.

Furthermore, the novel interdigitated dual-energy range sensor arrangement structure (1200) also includes one or more metal-oxide semiconductor (MOS) devices (1205) integrated monolithically on the single substrate (1209). In a preferred embodiment of the invention, a signal processing circuitry that produces an electrical signal proportional to a quantity of x-ray photons collected by each pixel over a detector control software-defined signal acquisition time is integrated in the single substrate (1209) as a MOS device.

Importantly, in this embodiment, a time-delayed integrated (TDI) circuitry that delays two or more electrical signals from a plurality of pixels and adds such signals to generate a larger and/or cleaner signal, which is proportional to the quantity of x-ray photons as the object moves through the detection area and forms an x-ray-scanned image of the object, is also monolithically integrated on the single substrate (1209) as part of the MOS devices (1205). Furthermore, as shown in this embodiment, the MOS devices (1205) are shielded from x-ray radiation from an x-ray source with a dense x-ray shield (1203), which may be made of lead or another high-density material suitable for blocking or reducing x-ray radiation exposure to the MOS devices (1205).

The operating environment in various embodiments of the present invention is described with respect to an x-ray-based object detector system that has the ability to discriminate between materials having similar areal densities, but different atomic numbers (Z). However, it will be appreciated by those skilled in the art that the invention is equally applicable for use with other spectral x-ray-based object detection systems.

A basic configuration of the x-ray-based object detector in a preferred embodiment of the present invention incorporates an x-ray image sensor comprising a plurality of pixel arrays aligned in a side-by-side, parallel, and closely-spaced arrangement. In particular, the pixel arrays should be placed as close together as possible. Ideally, they are spaced center-to-center with the same distance that pixels are spaced center-to-center (pixel pitch) but at a right-angle or perpendicular direction. For example, if the pixel pitch is 1.6 mm, then the arrays would be spaced 1.6 mm center-to-center. On a 1-to-1 aspect-ratio image, the leading array will output exactly one row before the trailing array. Due to fabrication considerations, it may be necessary to space the arrays further apart. It is useful to space using a multiple of the pixel pitch, e.g. 3.2 mm or 4.8 mm Photolithographic fabrication techniques used in semiconductor fabrication have precise placement, alignment, and registration of features on the semiconductor substrates. The side-by-side arrangement on a monolithic semiconductor chip assures that the multiple energy images have precise alignment and spacing.

As x-ray specimens (i.e. objects to be scanned) are transported across the multiple pixel arrays, their projected x-ray images are captured by the multiple pixel arrays. The precise alignment and spacing of the plurality of rows or columns of pixel arrays, which are at least in part enabled by monolithic side-by-side arrangement and integration into a single semiconductor substrate, assure that high-quality and satisfactory registration of the energy images. A specific point of the projected specimen image should be captured by a set of corresponding pixels from different energy arrays. This accurate registration allows for accurate material discrimination.

In the specific case of DE (i.e. dual-energy range) imaging, the alignment between LE and HE pixels provide for better matching of the measured signals of LE and HE x-ray absorption within the x-ray-scanned object. The matched absorption signals facilitate the determination of the material that best matches the pair of absorption signals. Better alignment, which results in improved matching, reduces error in the material determination by the x-ray-based object detector.

Furthermore, the advantageous close spacing allowed by semiconductor fabrication techniques on a monolithic substrate reduces the chance of misregistration that can increase as specimen travels further. The misregistration increases in two ways. First, the specimen may shift or rotate as they are transported due to jitter, twisting, or falling motion, especially if the specimen is not fully solid. Second, the x-ray projection angle changes with distance.

Moreover, the pixel elements themselves do not generally contain MOS devices that are susceptible to radiation damage. An x-ray shield is positioned between the x-ray source and any MOS devices, so that no incident x-rays will impinge on a MOS device. MOS devices can be monolithically integrated at a distance sufficiently far away from the pixel elements, yet still be positioned around the periphery of the pixel arrays to receive the benefit of an x-ray shield above or underneath the MOS devices. In one instance, the x-ray shield can be made of a dense and high-Z material capable absorbing a large majority of incident x-ray photons through the photoelectric absorption mechanism. In a preferred embodiment of the invention, a single x-ray shield can shield all the MOS devices below it, due to the parallel positioning of the x-ray shield above the MOS devices.

The signal processing circuitry integrated around the borders of the pixel arrays enables the pixel arrays to be read-out to external devices through an image sensor interface. Typically, these circuits are MOS devices, and also include pixel amplifiers. In addition, they can include gain amplifiers, noise-cancellation circuitry, signal-chain circuitry, output drivers, timing circuitry with digital scanning shift registers for selecting a series of pixels, and biasing circuitry. Because the signal processing circuitry is integrated on the same semiconductor chip monolithically, the capacitive and inductive parasitics of the inter-chip connections among multiple and separate chips are eliminated, thus providing noticeable reduction of parasitic-impedance-related noises.

Furthermore, a time-delayed integration (TDI) circuitry can also be integrated monolithically on one chip, along with the signal processing circuitry and at least two side-by-side x-ray-detecting pixel arrays. In a preferred embodiment of the invention, the TDI circuitry has stages, with each stage corresponding to a single one-dimensional pixel array (i.e. one row or one column of a pixel array). In a TDI operation, multiple TDI stages collect signal simultaneously. The same slice of an object under scan is collected by the different TDI stages at staggered times. The signals collected at the staggered times by different stages are then recombined to form greater signals. Preferably, in one or more embodiments of the invention, the TDI circuitry is integrated monolithically on one semiconductor substrate along with other signal processing circuitry and a plurality of x-ray-detecting pixel arrays to perform the TDI function on the same semiconductor chip. Integrating and utilizing the TDI circuitry on the same chip results in higher-fidelity imaging signals and an improved signal-to-noise ratio.

In various embodiments of the invention, silicon photodiode arrays, which are utilized as x-ray-detecting pixel arrays, and MOS circuitry related to the signal processing circuitry and the TDI circuitry are fabricated using a CMOS process. Because many electronic circuits, including the MOS devices on the same chip in this instance, are susceptible to x-ray radiation damage during the operation of the x-ray detector, they are shielded from direct-incident x-rays from the x-ray source with a dedicated and targeted-area radiation shield, as described earlier in numerous figures.

Another advantage of the high-level of integration, either multiple arrays on one substrate or signal processing and TDI circuitry on the same substrate, are simpler manufacturing processes and lower manufacturing cost. In contrast to a conventional stacked configuration that requires two printed circuit boards (PCB), this present DE detector can be manufactured on a single PCB.

In the case of multi-energy imaging with three or more arrays, there is the advantage of better material discrimination. In certain DE application cases, two dissimilar materials may have similar HE and LE signals and are easily confused. As more energy ranges or spectrum are collected and differentiated by an x-ray detector, it becomes easier to distinguish and visualize dissimilar materials. This is analogous to the case of a color-blind person having difficulty differentiating various objects with different colors, densities, and other visual or material characteristics.

The novel side-by-side monolithic arrangement of the dual-energy image sensor is advantageous over the stacked configuration for multiple reasons. For example, for implementing x-ray scanning detector systems which require increased signal levels and signal-to-noise ratios, the HE array would have higher x-ray signal since the LE array is no longer absorbing some portion of HE signal as it would in a stacked configuration.

Furthermore, an advantage of integrating MOS devices made of CMOS circuitries monolithically in one chip with the x-ray-detecting pixel arrays is that standard CMOS processes can be utilized for lower manufacturing costs. In addition, radiation hardening techniques for CMOS processes are widely available, which further simplify the manufacturing complexity of the novel x-ray detector that incorporates the novel side-by-side multi energy-range sensor arrangement structure.

In some embodiments of the invention, the pixel arrays may be implemented in other planar structures. There are multiple rectilinear arrangements that can be implemented other than side-by-side arrays. For example, the arrays can be interlaced or interdigitated. The arrays can be in a checkboard arrangement, similar to a filter mosaic for RGB imaging arrays. The pixel arrays are not necessarily rectilinear. They can also be circular, or any number of arbitrary shapes. Generally, the side-by-side construction is easier, but the other arrangements provide benefits such as possibly improved object scan and imaging registration. The pixel arrays themselves still do not contain MOS devices, and the MOS devices are preferably monolithically integrated in the same substrate in a peripheral area of the pixel arrays, wherein the peripheral area provides sufficient separation in distance to position a dedicated radiation shield for the MOS devices.

In an embodiment of the invention that utilizes the TDI circuitry for x-rayed object scanning (e.g. FIG. 5), the arrays can be side-by-side, but TDI opens up possibilities for other various geometrical allows arrangements. Similar to the embodiments not involving the TDI circuitry, the pixel arrays can also be in interlaced, interdigitated, and/or checkerboarded in pixel arrangements per array or per multiple arrays. The checkboard and other arrangements allow for common centroid layout, where the "center of gravity" of corresponding pixels share the same precise location. While this can make construction more complex, it may improve scanning quality and registration in certain situations involving various energy-detection applications.

In some embodiments of the invention, several smaller pixel sub-arrays can be "tiled" or butted together to create a complete pixel array, as shown in FIG. 4. It is beneficial to minimize the gap between tiles to provide a uniform array of pixels. The accurate registration of pixels in such embodiments does not preclude the use of software algorithms that improve the registration between corresponding pixels. Having accurate physical registration improves the performance of software algorithms and reduces the significance of tradeoffs such as loss of image resolution, sharpness, and fidelity.

In one embodiment of the invention, a software element, which may be a firmware or embedded codes in a hardware device, can be utilized to perform the TDI function off-chip, but it is preferred to be performed on-chip to reduce read-out noise and read-out bandwidth. If TDI is performed off-chip, then all the pixels need to be read-out before they can be stored and summed accordingly. In some embodiments of the invention, as in FIGS. 7, 8, 11, and 12, a software element can be used for interpolation to create signal for a virtual pixel, where an actual pixel does not exist, by using the signal from neighboring pixels.

Furthermore, a software element can be used to reduce the effects of misalignment by various methods, such as (1) Detecting edges and reducing material discrimination error at the edges. If there is a misalignment, the edges of objects will often have a mismatch (e.g. between HE and LE signals). Such a mismatch will lead to incorrect material determination. Software elements can be utilized to detect such errors near the edges of objects that are made up of uniform material and to compensate for them. (2) Correcting for pixel misalignment (e.g. between HE and LE pixels) by offset adjustment. If the software is calibrated or can automatically detect the amount of pixel misalignment, then it can compensate the misalignment by interpolating pixels to estimate the signals of virtual pixels that are aligned.

Software elements can also be utilized for material determination and discrimination. Since different energy x-rays are absorbed by different materials at different rates, the different energy signals (e.g. HE and LE signals) are a function of the object material and density. The different energy signals can be back-calculated to provide material and density. This can be done with a lookup table.

These and other objects and advantages of the present invention will become apparent to those skilled in the art, in view of the description of the best presently known mode of carrying out the invention as described herein and as illustrated in the drawings.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A dual-energy range x-ray detector comprising:
a pair of one-dimensional pixel arrays physically positioned in parallel to each other, wherein a first pixel array selectively detects higher-energy x-ray photons relative to a second pixel array among the pair of one-dimensional pixel arrays, wherein the pair of one-dimensional pixel arrays and metal oxide semiconductor devices (MOS) are integrated monolithically on a single semiconductor chip;
a filter placed in front of the first pixel array; and
a high-density x-ray shielding that sufficiently attenuates x-rays from directly impinging on the MOS devices near the first pixel array and the second pixel array, wherein a straight-line x-ray path emanating from a source of the x-rays intersects the first pixel array and the second pixel array in the pair of one-dimensional pixel arrays simultaneously, and wherein the x-rays not attenuated by, scattered by, or intersected with the x-ray shielding also does not impinge on the MOS devices near the pair of one-dimensional pixels arrays.

2. The dual-energy range x-ray detector of claim 1, wherein the second pixel array selectively detects lower-energy x-ray photons relative to the first pixel array among the pair of one-dimensional pixel arrays.

3. The dual-energy range x-ray detector of claim 1, wherein pixels in the pair of one-dimensional pixel arrays contain photodiodes or photoelements that are resistant to radiation damage.

4. The dual-energy range x-ray detector of claim 1, wherein pixels in the pair of one-dimensional pixel arrays contain scintillator material that lowers energy levels of the higher-energy photons or converts the higher-energy photons to visible photons that are readily detectable by photodiodes.

5. The dual-energy range x-ray detector of claim 1, wherein the MOS devices near the first pixel array and the second pixel array are CMOS field-effect transistors and capacitors.

6. The dual-energy range x-ray detector of claim 1, wherein pixels in the pair of one-dimensional pixel arrays are implemented on a multiple number of semiconductor substrates that are arranged tightly in tile formations to constitute a complete dual array of photodiodes or photoelements incorporated in the pair.

7. The dual-energy range x-ray detector of claim 1, wherein the filter is made at least in part from gold, silver, copper, tin, or a combination thereof.

8. The dual-energy range x-ray detector of claim 1, further comprising a non-transitory software component configured to correlate, synchronize, and interpret information from the pair of one-dimensional pixel arrays physically positioned in parallel to each other.

9. The dual-energy range x-ray detector of claim 1, further comprising one or more additional one-dimensional pixel arrays to detect and distinguish various energy levels from the x-rays.

10. A dual-energy range x-ray detector comprising:
a detector area located on a monolithic substrate;
a pair of one-dimensional x-ray-detecting pixel arrays located on the detector area in a horizontally-parallel arrangement to each other, wherein the horizontally-parallel arrangement is perpendicular to a straight-line x-ray path emanating from an x-ray source positioned above or below the detector area, and wherein each pixel array has a different spectral response;
a metal-oxide semiconductor (MOS) device that receives detection signals from pixels in the pair of one-dimensional x-ray-detecting pixel arrays, wherein the MOS device is sufficiently apart from the pair of one-dimensional x-ray-detecting pixel arrays to be shielded from an x-ray radiation even within the detector area; and
an x-ray shielding unit positioned above or below the MOS device to provide a selective x-ray radiation shielding within the detector area.

11. The dual-energy range x-ray detector of claim 10, further comprising a filter positioned along the straight-line x-ray path between the x-ray source and one of the pair of one-dimensional x-ray-detecting pixel arrays.

12. The dual-energy range x-ray detector of claim 11, wherein the filter is made at least in part from gold, silver, copper, tin, or a combination thereof.

13. The dual-energy range x-ray detector of claim 10, wherein the monolithic substrate is part of a CMOS silicon chip designed with a radiation-hardening process.

14. The dual-energy range x-ray detector of claim 10, wherein pixels in the pair of one-dimensional x-ray-detecting pixel arrays contain photodiodes or photoelements that are resistant to radiation damage.

15. The dual-energy range x-ray detector of claim 10, wherein pixels in the pair of one-dimensional pixel arrays contain scintillator material that lowers energy levels of higher-energy photons or converts the higher-energy photons to visible photons that are readily detectable by photodiodes.

16. The dual-energy range x-ray detector of claim 10, wherein the MOS device is a CMOS field-effect transistor or a capacitor.

17. The dual-energy range x-ray detector of claim 10, wherein each of the pair of one-dimensional x-ray-detecting pixel arrays comprises a plurality of smaller and separate pixel arrays that are tiled together in a lateral, arced, staggered, or overlapped arrangement to constitute a complete pixel array within the pair.

18. The dual-energy range x-ray detector of claim 10, further comprising a non-transitory software component configured to correlate, synchronize, and interpret information from the pair of one-dimensional x-ray-detecting pixel arrays.

19. A dual-energy range x-ray detector comprising:
a detector area on a geometric plane oriented to receive x-ray photons emanating from an x-ray source;
the x-ray source located above or below the detector area, wherein the x-ray source transmits the x-ray photons through an object moving transversely between the x-ray source and the detector area;
a pair of pixel arrays located on the detector area, wherein a first pixel array selectively collects a first subset of the x-ray photons with a first x-ray energy spectral response different from a second subset of the x-ray photons exhibiting a second x-ray energy spectral response, which is selectively collected by a second pixel array among the pair of pixel arrays;
a signal processing circuitry that produces an electrical signal proportional to a quantity of x-ray photons collected by each pixel over a signal acquisition time defined by a detector control software embedded or operatively connected to the signal processing circuitry; and
a time-delayed integrated (TDI) circuitry that delays two or more electrical signals from two or more pixels, and adds the two or more electrical signals to generate a larger or cleaner signal proportional to the quantity of x-ray photons as the object moves transversely between the x-ray source and the detector area, wherein a plurality of added signals from the TDI circuitry forms an image of the object that moved through the detector area.

20. The dual-energy range x-ray detector of claim 19, wherein the detector area, the pair of pixel arrays, the signal processing circuitry, and the TDI circuitry are integrated monolithically on a single semiconductor chip.

* * * * *